United States Patent [19]
Kammerer et al.

[11] Patent Number: 4,780,788
[45] Date of Patent: Oct. 25, 1988

[54] TWO-WIRE SWITCH WITH A POWER TRANSISTOR

[75] Inventors: Heinz Kammerer, Ostfildern; Peter Dolderer, Esslingen, both of Fed. Rep. of Germany

[73] Assignee: Gebhard Balluff Fabrik Feinmechanischer Erzeugnisse GmbH & Co., Fed. Rep. of Germany

[21] Appl. No.: 919,892

[22] Filed: Oct. 14, 1986

[30] Foreign Application Priority Data

Oct. 17, 1985 [DE] Fed. Rep. of Germany ....... 3536925

[51] Int. Cl.$^4$ .............................................. H02H 3/38
[52] U.S. Cl. ...................................... 361/93; 361/18; 361/79
[58] Field of Search ................... 361/18, 79, 86–89, 361/90, 91, 93; 363/50; 323/275, 285, 246

[56] References Cited

U.S. PATENT DOCUMENTS

| 3,317,795 | 5/1967 | Steen | 361/79 X |
| 3,582,713 | 6/1971 | Till | 361/79 |
| 3,809,999 | 5/1974 | Smith | 361/18 X |
| 4,045,887 | 9/1977 | Nowell | 361/18 X |
| 4,378,580 | 3/1983 | Stich | 361/18 X |
| 4,631,623 | 12/1986 | Gohl | 361/86 |

Primary Examiner—Roy N. Envall, Jr.
Assistant Examiner—A. Jonathan Wysocki
Attorney, Agent, or Firm—Lorusso & Loud

[57] ABSTRACT

The invention relates to a two-wire switch with a power transistor, in particular, a VMOS transistor which is arranged in series with an auxiliary impedance between two switch connection lines. In accordance with the invention, a logic circuit with an OR function and an AND function is used in the realization of a kind of phase angle control for the power transistor in the presence of an activating signal of an initiator at the switch input.

20 Claims, 8 Drawing Sheets

TWO-WIRE SWITCH WITH A POWER TRANSISTOR

BACKGROUND OF THE INVENTION

The invention relates to a two-wire switch with a power transistor, in particular, a VMOS transistor, which is arranged in series with an auxiliary impedance between two switch connection lines which are connectable to the poles of a dc voltage source for generation of a dc voltage pulsating between zero and a maximum value, with an, in particular, contactlessly, externally influenceable initiator for generation of blocking and driving signals for the transistor, and with an auxiliary voltage source for generation of an auxiliary voltage pulsating with the frequency of the pulsating dc voltage.

Such a two-wire switch is known from German Offenlegungsschrift No. 3,320,975. The known two-wire switch comprises as auxiliary impedance, in particular, a diode connected in series with the power transistor, with a capacitor serving as buffer capacitor to generate an input voltage for a dc-dc converter connected in parallel therewith.

An auxiliary voltage which may be used as supply voltage for the oscillator of the initiator, as supply voltage for an amplifier and, possibly, as control voltage for the power transistor, is gained from the voltage dropping over the diode, in the activated state of the power transistor, with the aid of the dc-dc converter by inductive or capacitive voltage multiplication.

In the known solution, the fact that generation of the auxiliary voltage involves an increased voltage drop over the switching path may prove to be a problem, particularly if the power transistor is a VMOS transistor requiring a high control voltage. In this case, allowance should be made for the fact that the voltage over the diode may, on account of the voltage multiplication in the converter, be smaller than the auxiliary and control voltages ultimately required, but, on the other hand, it must be high enough for not only a sufficiently high voltage, but altogether a sufficiently high energy to be available on the output side of the converter.

On the basis of this prior art, the object underlying the invention is to so improve a two-wire switch of the kind mentioned at the outset that the voltage drop in the load circuit of the switch is reducible to a minimum.

SUMMARY OF THE INVENTION

This object is attained in accordance with the invention in that a logic circuit is provided, which comprises a circuit component operating in accordance with an OR function and comprising a first input and a second input, and a circuit component operating in accordance with an AND function and comprising two inputs, one of its inputs being connected to the output of the first circuit component, and its other input forming a third input of the logic circuit, in that the first input is connected to the output of the auxiliary voltage source, in that the second input is connected to a common connection point of power transistor and auxiliary impedance, and in that the third input is connected to the output of the initiator, and in that the logic circuit is so designed that the power transistor is blockable at any point in time by a blocking signal of the initiator and is then drivable by a driving signal of the initiator for the rest of the instant pulse of the pulsating dc voltage when the voltage at the first or second input (a and b, respectively) of the logic circuit (38) exceeds a threshold value corresponding to a logic "1".

The inventive transistor-two-wire-switch, therefore, operates with a kind of phase angle control, so that, similar to a thyristor-two-wire-switch with phase angle control, a high input voltage is available to the auxiliary voltage source, throughout the precisely predeterminable angle provided by the phase angle control, also when the initiator supplies a driving signal, by means of which the power transistor of the known circuit is brought into the conducting state, leaving only a low residual voltage, which is possibly kept higher than would normally be required, in order to have adequate energy available on the input side of the auxiliary voltage source.

Accordingly, the invention provides advantages similar to those of a thyristor-two-wire-switch, for generation of the auxiliary voltage, while fully maintaining the special advantages of a transistor-two-wire-switch as regards the possibility of quickly blocking the load circuit, with the result that a reliable short-circuit protection is attainable.

The auxiliary voltage source for generation of the voltage at the first input of the logic circuit may in the simplest case be a voltage divider between the switch connection lines, with the first input of the logic circuit connected to its tap. In this case, a supply circuit of its own, preferably designed as voltage regulator with a storage member is then required for the voltage supply of the initiator and possibly the switching circuits of the logic circuit. The first connection of the logic circuit may, however, also be directly connected to the output of such a voltage regulator.

It has proven particularly expedient for the auxiliary voltage source to be designed so as to make available, in addition to the normal supply voltage, an increased voltage suitable as control voltage for a VMOS power transistor requiring a higher voltage to drive it than, for example, that which is needed to supply the initiator. The increased voltage which at first is only available throughout the precisely predeterminable angle provided by the phase angle control, may, in this case, be used to charge a capacitor which supplies the necessary control voltage when the transistor is in the activated state.

It has proven favorable for the transistor at the input side of the auxiliary voltage source to be a VMOS transistor, since, in this case, only a low driving power is required for the auxiliary voltage source, and for the further transistor to be a Darlington transistor which, throughout the precisely predeterminable angle provided by the phase angle control, provides a sufficiently high current to charge the capacitor at the output of the auxiliary voltage source.

It has furthermore proven advantageous, in one configuration of the auxiliary voltage source for light-emitting diodes which may serve to indicate initiation of a short-circuit protection circuit and act as function display and as operating voltage display, respectively, to be connected, in each case, in series with the switching paths of the two transistors.

In accordance with the invention, it has furthermore proven expedient to provide a circuit for switch-on pulse suppression to generate a blocking signal to block the power transistor, for a preferably settable delay time after the dc voltage source is switched on.

It has also proven advantageous to provide a short-circuit and overload protection circuit to generate, at least for the duration of a short-circuit and overload condition, respectively, a blocking signal to block the power transistor and, possibly, further switching circuits, in particular, the auxiliary voltage source. In this case, use of a power transistor in the load circuit has the special advantage that in the event of a short-circuit, a practically undelayed blocking of the load circuit is also enabled during the instant pulse of the pulsating dc voltage.

The short-circuit and overload protection circuit is preferably designed in such a way that in the event of a short-circuit, it initiates without delay blocking of the power transistor, whereas in the event of an overload and an overcurrent, respectively, a —delayed —switching-off of the power transistor is only effected on the condition that the overload lasts for a time interval longer than the time interval predetermined by the time member.

It has also proven expedient to provide as output circuit of the protection circuit, a memory circuit (latch) which generates a blocking signal up until the switch is externally returned to the ready for operation state following elimination of the short-circuit and overload condition, respectively.

It has furthermore proven advantageous for an astable multivibrator whose output signals serve to activate a light-emitting diode to generate periodic flashing signals, and, in particular, the light-emitting diode in the input circuit of the auxiliary voltage source, to be connected to the output of the store circuit. Such a flashing light-emitting diode is very effective in signalizing the malfunction to the operator.

The configuration of the protection circuit has also proven particularly advantageous since an adequate voltage difference for the transistor serving as switch can be generated without any difficulty serving with the aid of the low-resistance measuring resistor in the load circuit, while the diode serving in the load circuit reacts to current changes at higher currents with a voltage change between its connections which is hardly evaluatable.

In accordance with the invention, it is particularly expedient, to arrange parallel to the diode over which the voltage drop for activating the second input of the logic circuit is ascertained, an ohmic resistor over which the voltage drops earlier than over the diode when the current falls towards the end of a pulse of the pulsating dc voltage, so that the power transistor can be blocked on time, in order to attain complete blocking of the latter at the end of each dc voltage pulse.

It has furthermore proven advantageous for the OR function of the logic circuit to be realized using two operational amplifiers since these operate in a substantially drift-free manner, so that the precisely predeterminable angle provided by the phase angle control is not affected by temperature changes or the like.

It has also proven expedient to provide at the output of the phase angle control a trigger circuit which, upon occurrence of the switching condition, supplies a steep pulse edge and thus likewise contributes towards maintenance of a precisely predeterminable angle provided by the phase angle control. This trigger circuit may, depending on the switching technique requirements, have a negated output, but it should be noted at this point that in a two-wire switch according to the invention, an inverting of the signals at other points of the circuit may also be expedient, in order to finally obtain the desired logical interrelationship (Boolean function) for switching on and off the power transistor in the load circuit.

BRIEF DESCRIPTION OF THE DRAWING

Further details and advantages of the invention will now be explained at greater length, with reference to the drawings, in which.

DESCRIPTION OF THE PREFERRED EMBODIMENTS

Figure 1:
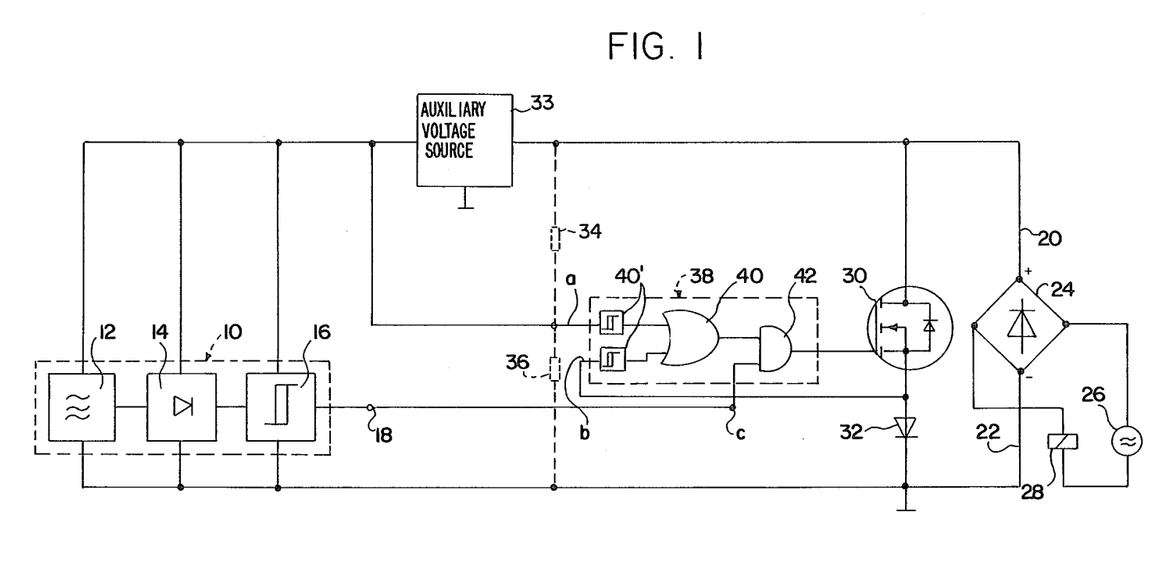
FIG. 1 shows a basic circuit diagram of a two-wire switch according to the invention.

FIG. 1 shows an initiator 10, more particularly, a contactless proximity switch with an oscillator 12, a demodulator and rectifier 14, respectively, and a trigger stage 16, whose output 18 forms the output of the initiator 10.

The initiator 10 is a component of a two-wire switch with two switch connection lines 20, 22 connected to the poles of a dc voltage source, namely to the positive connection (+) and to the negative connection (−) of a full-wave rectifier bridge 24. On the input side, the bridge is connected to one pole of an ac voltage source 26, whose other pole is connected via a load 28, illustrated as a relay, to the other input connection of the bridge 24. Arranged between the switch connection lines 20, 22 is an auxiliary voltage source 33 which could also be referred to as voltage regulator and current supply, respectively, and which serves to supply the individual switching circuits 12 to 16 of the initiator 10 with an operating current and an operating voltage, respectively, also when, in the activated state of the transistor 30, there is practically no more voltage available or only minimal residual voltage left between the connection lines 20, 22. Such auxiliary voltage sources are known, for example, in thyristor-two-wire-switches, where the same problem arises when the thyristor is activated. They generate at their output an auxiliary voltage U which alters with the clock pulse of the pulsating dc voltage at the output of the rectifier bridge 24, and, more particularly, in such a way that the auxiliary voltage U at first rises relatively rapidly throughout the precisely predeterminable angle provided by the phase control, and then after activation of the control path which, in the circuit according to the invention, contains the transistor 30, drops relatively slowly until occurrence of the next zero value of the pulsating dc voltage.

In accordance with the invention, the output of the auxiliary voltage source 33 is connected to a first input a of a logic circuit 38 comprised of an OR gate 40 and an AND gate 42, and both gates 40, 42 each have two inputs. The two inputs of the OR gate 40 form a first input a and a second input b of the logic circuit. Threshold switches and trigger stages 40', respectively, may be inserted into the pertinent input lines, as indicated in FIG. 1 of the drawings, in order to obtain clearly defined input signals for the OR gate 40, but the desired OR function may also be attained by corresponding internal configuration of the OR gate itself. The output of the OR gate 40 is connected to one input of the AND gate 42, whose other input c is connected to the output 18 of the initiator 10. The output of the AND gate 42 is connected to the control electrode (gate) of the transistor 30. The transistor 30 is fired and brought into the conducting state, respectively, when a signal corresponding to a logic "1" occurs at the output of the AND gate 42, in which case, the AND gate 42 must, of course, be of such configuration that this logic "1" corresponds to a signal whose voltage is adequate to bring the pertinent transistor 30 into the conducting state. In the case of VMOS transistors, a control voltage of approximately 2 to 3 V or also of approximately 8 to 12 V is required, depending on the type used.

As is apparent from the above description of the inventive two-wire switch according to FIG. 1, the transistor 30 can be blocked at any point in time by a signal from the output 18 of the initiator 10 corresponding to a logic "0", since such an "0" signal at the third input c of the logic circuit 38 automatically leads to an "0" at the output of the AND gate 42, which means that there is no more voltage available at the control electrode of the transistor 30 to bring the transistor 30 into the conducting state or to keep it in this state.

If, on the other hand, a driving signal corresponding to a logic "1" is present at the output 18 of the initiator 10, then a logic "1" causing the transistor 30 to be driven is obtained at the output of the AND gate 42 when a logic "1" is present at the output of the OR gate 40, i.e., when a signal corresponding to a logic "1" is present at one of the two inputs a or b. The latter is the case in the inventive two-wire switch when the auxiliary voltage U at the output of the auxiliary voltage source 33, starting from an at first lower level, reaches at a predetermined point in time after commencement of a new pulse of the pulsating dc voltage at the output of the bridge circuit 24, a predetermined level corresponding to the logic "1", so that, in the presence of a driving signal at the output 18 of the initiator 10, after a zero passage of the ac voltage on the input side of the bridge circuit 24, the transistor 30 is brought into the conducting state in a delayed manner. Accordingly, a kind of phase angle control, as is known in thyristor-two-wire-switches, is simulated for the driving of the transistor 30, in order to ensure, also in the activated state of the transistor 30, adequate supplying of the auxiliary voltage source 33, so that the latter can constantly supply the required auxiliary voltage U which, however, as explained above, is not a constant voltage, but instead a voltage which pulsates with the clock pulse of the pulsating dc voltage, yet never drops to zero in the steady state of the circuit.

Once the transistor 30 is fired, the voltage between the switch connection lines 20 and 22 breads down to a minimal residual voltage. The major part of this residual voltage is present over the diode 32 and thus also at the second input b of the logic circuit 38, where it forms, in the activated state of the transistor 30, a signal corresponding to a logic "1" for the OR gate 40, so that the switch-on condition for the transistor 30 is maintained until the current flowing through the series connection of the transistor 30 and the diode 32 falls, on account of the dropping of the pulsating dc voltage of the rectifier bridge 24, so far that the voltage over the diode 32 is no longer high enough to correspond to a logic "1". Accordingly, the transistor 30 is blocked towards the end of each pulse of the pulsating dc voltage and towards the end of the pertinent half-wave of the alternating current on the input side of the rectifier bridge 24, respectively, and is switched on again only with delay at the next half-wave. As indicated by a dashed line in FIG. 1, it is also possible to generate the pulsating dc voltage at the input a of the logic circuit by connecting this first input a of the logic circuit 38 to the tap of a voltage divider which is comprised of two resistors 34, 36 and is arranged parallel to the series connection 30, 32 between the switch connection lines 20, 22. In this case, the connection of the output of the auxiliary voltage source 33 to the first input a of the logic circuit 38 is, of course, eliminated. On the other hand, use of a voltage divider 34, 36 of its own to generate the pulsating auxiliary voltage at the input a of the logic circuit 38 enables operation with an auxiliary voltage which is independent of the supply voltage required for the various component groups of the two-wire-switch.

The auxiliary voltage source 33 which is preferably in the form of a voltage regulator with energy store ( capacitor ), generates in addition to the auxiliary and supply voltage U, respectively, for the component groups 12 to 16 of the initiator 10, normally also the supply voltage for the gates 40 and 42 and, possibly, the trigger stages 40' of the logic circuit 38. In FIG. 1, however, no corresponding lines are drawn, since, in principle, passive gates 40, 42 without a separate current supply, which operate solely with the auxiliary voltage U at the first input a and with the voltage dropping over the diode 32 at the second input b, respectively, may be used.

While the principle of an inventive transistor-two-wire-swtic with simulated phase angle control has been explained hereinabove with reference to FIG. 1 of the drawings, the practical realization of a transistor-to-wire-switch according to the invention will be described in detail hereinafter with reference to FIGS. 2 to 8.

Figure 2:
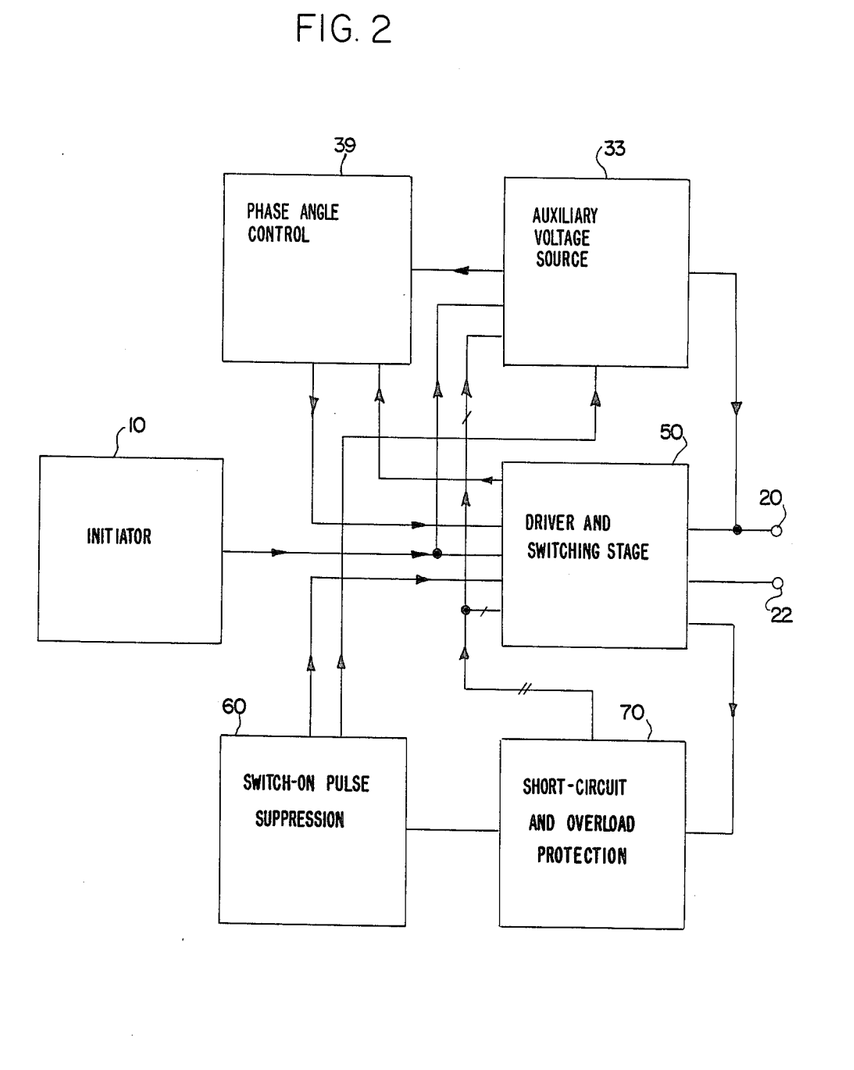
FIG. 2 shows a block circuit diagram of a preferred embodiment of a two-wire switch according to the invention.

FIG. 2 shows a block circuit diagram of this switch comprising an initiator 10, an auxiliary voltage source 33, a phase angle control 39, a driver and switching stage 50, a circuit 60 for switch-on pulse suppression and a short-circuit and overload protecton circuit 70. In the block circuit diagram according to FIG. 2, the individual circuit blocks are interconnected via signal lines, with the number of wires in multi-wire signal lines indicated in the usual way by corresponding diagonal lines, and the direction of the signals shown, in each case, by an arrow and a double arrow, respectively. It should also be noted that only the switch connection lines 20 and 22, whose external ends are to be connected in the usual way to the rectifier bridge 24, as shown in FIG. 1, are drawn as inputs of the driver and switching stage.

In the circuit diagram according to FIG. 3, the circuits 10, 39, 50, 60 and 70 referred to hereinabove are again illustrated as blocks, while a detailed circuit diagram is shown for a preferred embodiment of the auxiliary voltage source 33.

Figure 3:
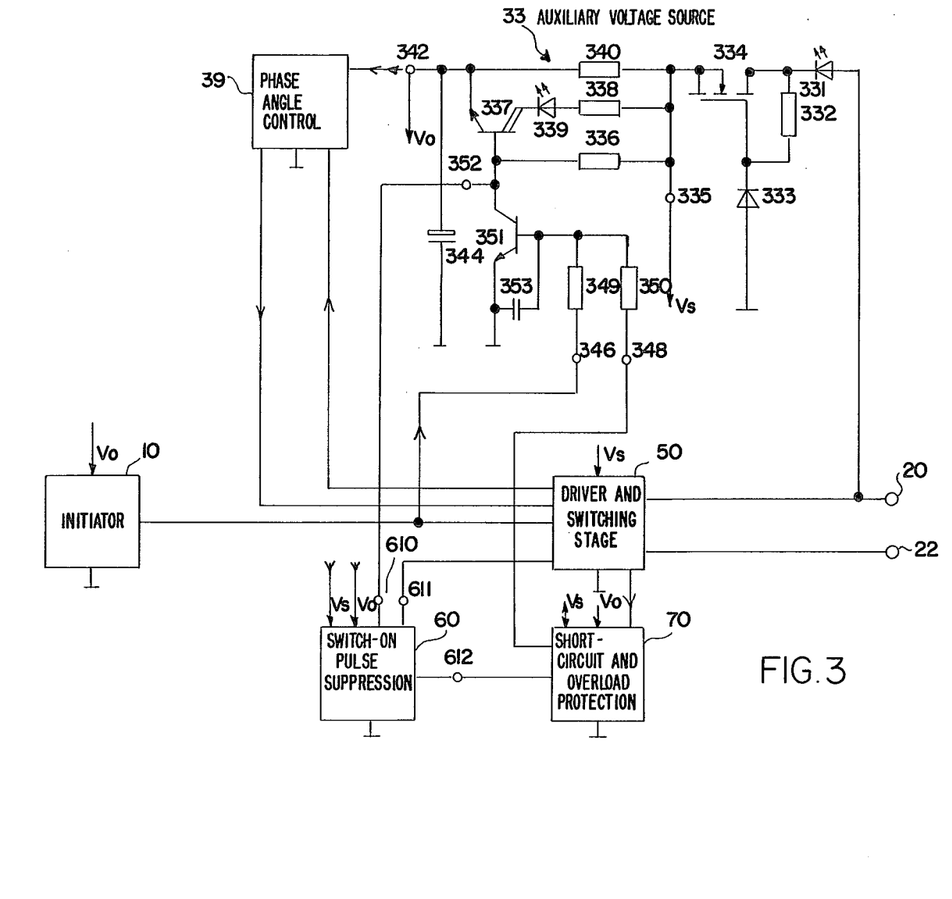
FIGS. 3 to 7 show detailed circuit diagrams of the individual circuit blocks of the two-wire switch according to FIG. 2.

The auxiliary voltage source 33 according to FIG. 3 comprises on the input side a light-emitting diode 331, whose anode is directly connected to the switch connection line 20 and to the + output of the rectifier bridge 24, respectively. The cathode of the light-emitting diode 331 is connected via a resistor 332 and a Zener diode 333 to reference potential, and also directly to the drain electrode of a VMOS transistor 334 whose gate electrode is connected to the connection point of the resistor 332 and the Zener diode 333. The source electrode of the transistor 334 is directly connected to an output connection 335 of the auxiliary voltage source 33, at which an increased positive voltage $V_s$ can be tapped, as will be explained in further detail hereinafter. The source electrode is furthermore connected via a resistor 336 to the base of a Darlington transistor 337, via the series connection of a resistor 338 and a light-emitting diode 339 to the collector of the transistor 337 and via a resistor 340 to the emitter of this transistor 337, which forms the output 342 of the auxiliary voltage source 33. Quite a large capacitor 344 is arranged parallel to the output and between the output 342 and reference potential, respectively, and in the operating state, a smaller pulsating dc voltage $V_o$ is available at the output 342.

Two further inputs 346 and 348 of the auxiliary voltage source 33 are connected, in each case, via a resistor 349 and 350, respectively, to the base of a transistor 351, whose collector forms a further input 352 of the auxiliary voltage source 33 and is connected to the base of the Darlington transistor 337, while its emitter is connected to reference potential and, in addition, via a capacitor 353 to its base.

The auxiliary voltage source 33 operates as follows:

Where there is a voltage rise from zero to a positive value on the line 20, the transistor 334 is made conductive practically immediately, so that the voltage $V_s$ at the output 335 rises to a maximum value which is predetermined by the Zener diode 333. In the embodiment, a maximum value of approximately 15 V was predetermined for the voltage $V_s$. This is attained by a breakdown voltage of the Zener diode 333 which is higher by the amount of the voltage drop via the transistor 334 (approximately 2 V).

The capacitor 344 is charged via the Darlington transistor 337 which is made conductive if there is a corresponding output voltage at the source electrode of the transistor 334. The resistor connected in series with the switching path of the transistor 337 serves to limit the current, and the light-emitting diode 339 indicates the flow of a charging current to the capacitor 344 (function display). The transistor 351 serves to effect blocking of the transistor 337 in the presence of corresponding output signals from the circuit 70 and the initiator 10, respectively. The transistor 337 may furthermore be blocked by an output signal from the circuit 60 for switch-on pulse suppression.

Figure 4:
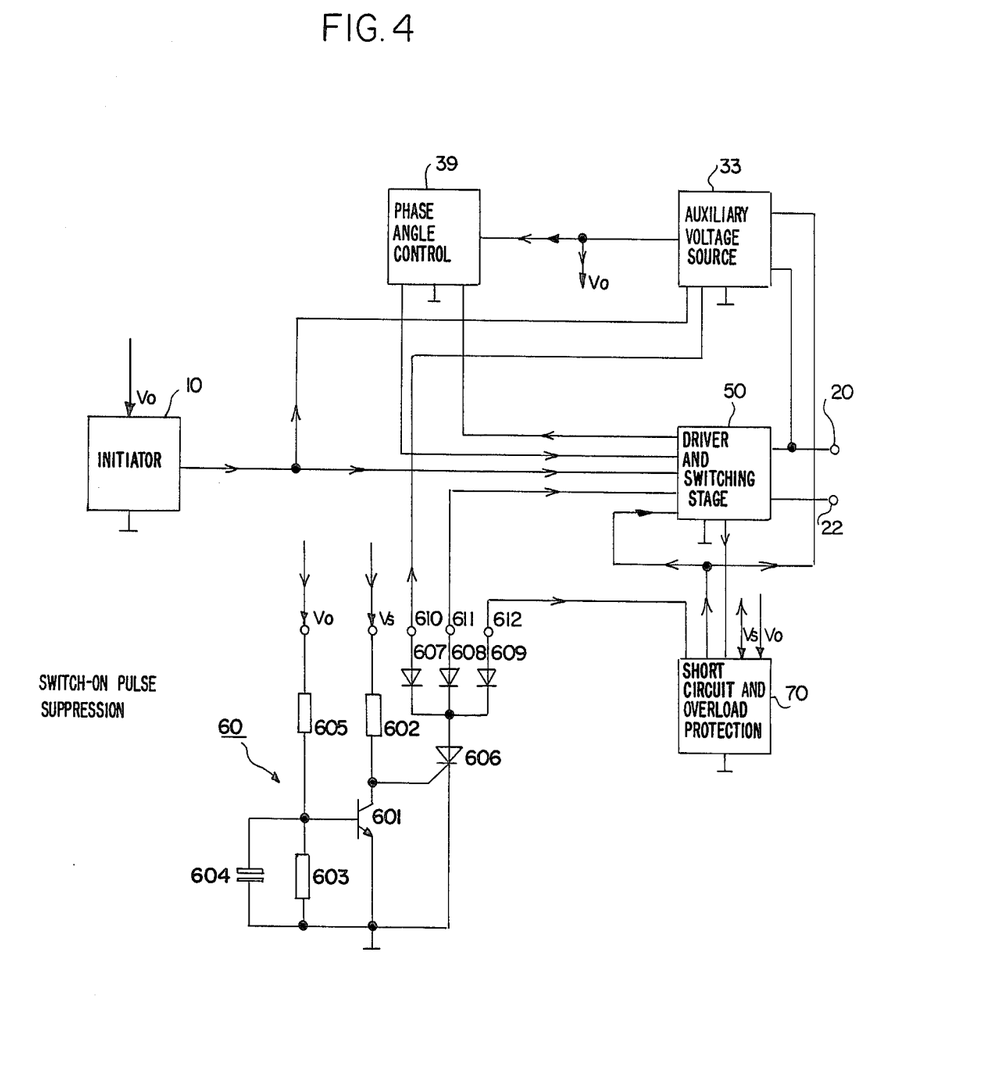

The circuit 60 for switch-on pulse suppression is illustrated in detail in FIG. 4 and comprises a transistor 601 whose emitter is connected to reference potential and whose collector is connected via a resistor 602 to the connection 335 of the auxiliary voltage source 33. The base of the transistor 601 is connected via the parallel connection of a resistor 603 and a capacitor 604 to reference potential and via a resistor 605 to the connection 342 of the auxiliary voltage source 33. The circuit 60 furthermore comprises a thyristor 606, whose cathode is connected to reference potential, whose control electrode is connected to the collector of the transistor 601 and whose anode is connected via decoupling diodes 607, 608 and 609 to three output connections 610, 611 and 612.

When the two-wire switch is switched on, the voltage $V_s$ which brings the thyristor 606 into the conducting state via its control electrode, appears at the connection 335 of the auxiliary voltage source practically without delay, which results in a blocking of the transistor 337 of the auxiliary voltage source 33 via the outputs 610, 611 and 612 and also in a blocking of the driver and switching stage 50 and of the short-circuit and overload protection circuit 70 in a manner which will be described in greater detail hereinafter. Only after a build-up of the voltage $V_o$ over the capacitor 344 in dependence upon the charging current flowing through the resistor 340, to a value which is high enough to ensure perfect functioning of the various switching circuits, is the transistor 601 brought into the conducting state and thus connects reference potential to the control electrode of the thyristor 606, so that the latter is blocked, and the previously blocked switching circuits and circuit parts, respectively, are released for normal operation. It is important that the thyristor 606 be so selected and switched that only a current below its holding current flows in the conducting state, and it can, consequently, be blocked by its control voltage dropping. Once the thyristor 606 is blocked, the Darlington transistor 337 becomes conductive, so that the current flowing to the capacitor 344 can now pass over the low-resistance switching path of this transistor.

The auxiliary and supply voltage $V_o$ at the output 342 is fed, inter alia, also to the phase angle control 39, whose configuration will be explained in detail hereinafter with reference to FIG. 5 of the drawings.

Figure 5:
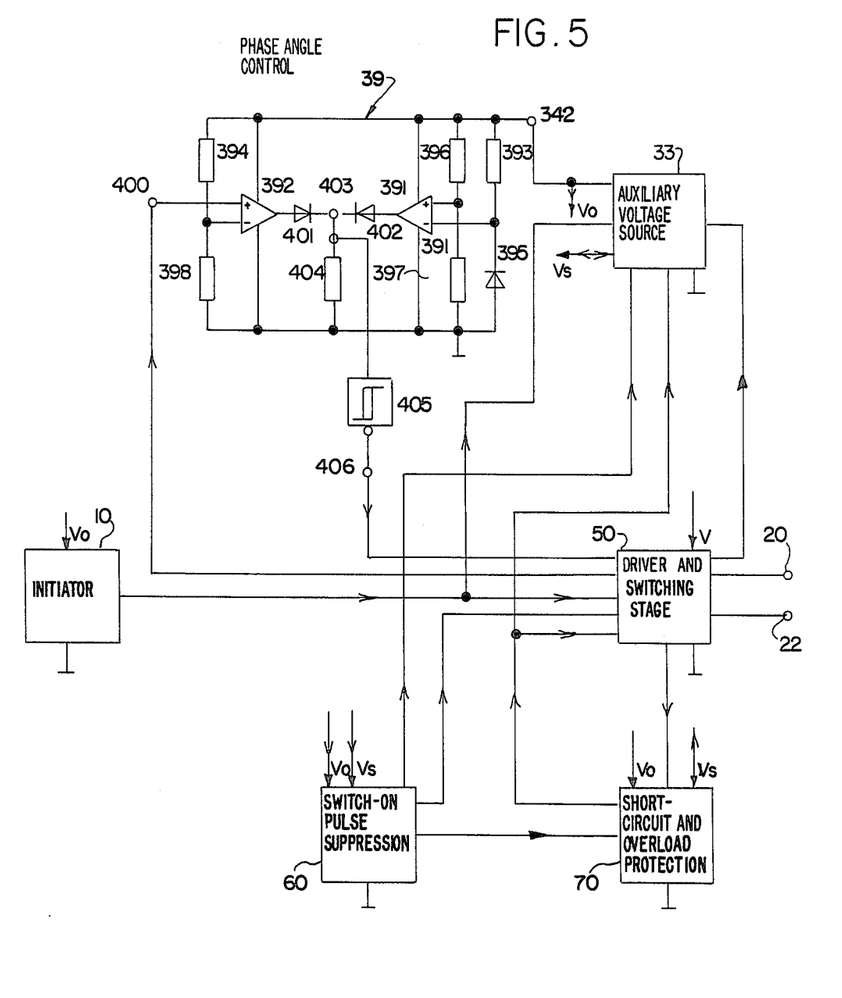

As FIG. 5 shows, the phase angle control 39 comprises two operational amplifiers 391, 392, whose inverting inputs (−) are connected, in each case, via one resistor 393 and 394, respectively, to the output 342 of the supply voltage source 33. The inverting input of the operational amplifier 391 is also connected via a Zener diode 395 to reference potential. The non-inverting input (+) of the operational amplifier 391 is connected to the tap of a voltage divider comprised of two resistors 396, 397. The operational amplifier 391 thus supplies a positive output signal when the voltage at the non-inverting input is more positive than a reference voltage predetermined by the Zener diode 395. The inverting input of the other operational amplifier 392 is connected via a further resistor 398 to reference potential. The resistors 394 and 398 therefore form a voltage divider, with the inverting input of the operational amplifier 392 connected to its tap. The non-inverting input (+) of the operational amplifier 392 which, like the first operational amplifier 391, is connected as comparator, is, as will be explained in greater detail hereinafter, connected in the driver and switch stage 50 to a circuit point 400 at which a voltage corresponding to the current in the load circuit of the two-wire switch is present. The outputs of the two operational amplifiers are connected via decoupling diodes 401, 402 to a circuit point 403 which is connected via a resistor 404 to reference potential and via a trigger circuit 405 with a negated output to the output connection 406 of the phase angle control 39.

On account of the above-described configuration, no positive voltage appears at first at the circuit point 403, at the beginning of each pulse of the pulsating dc voltage, until the signal at the + input of the operational amplifier 391 becomes larger than the reference voltage via the Zener diode 395. During this phase, the trigger circuit 405 generates a low-level output signal which is converted by inverting into a high-level signal corresponding to a logic "1". When a voltage above the reference voltage is attained at the non-inverting input of the operational amplifier 391, a positive signal then occurs at the circuit point 403, resulting at the output of the trigger circuit 405 in a high-level signal which is converted by inverting into a low-level signal corresponding to a logic "0". As long as there is no current flow in the load circuit of the two-wire switch and as long as a load transistor of the driver and switching stage 50 is blocked, respectively, the signal at the non-inverting input of the operational amplifier 392 is also smaller than the signal at the inverting input of the latter, so that the second operational amplifier 392 generates a low-level signal at the circuit point 403. However, once the load transistor is activated, a high-level signal occurs at the output of the second operational amplifier 392. This signal does not end until the current in the load circuit has dropped sufficiently low towards the end of a pulse of the pulsating dc voltage. Although the auxiliary voltage U at the non-inverting input of the first operational amplifier 391 drops again below the reference voltage at the Zener diode 395 in the course of a pulse of the pulsating dc voltage, the inverted output signal of the trigger circuit 405 therefore remains, after having jumped to a low level, at a low level corresponding to a logic "0" until the end of the pertinent pulse. Accordingly, in the embodiment under consideration, the phase angle control 39 practically constitutes an OR gate corresponding to the OR gate 40 of the logic circuit 38 of the two-wire switch according to FIG. 1.

Figure 6:
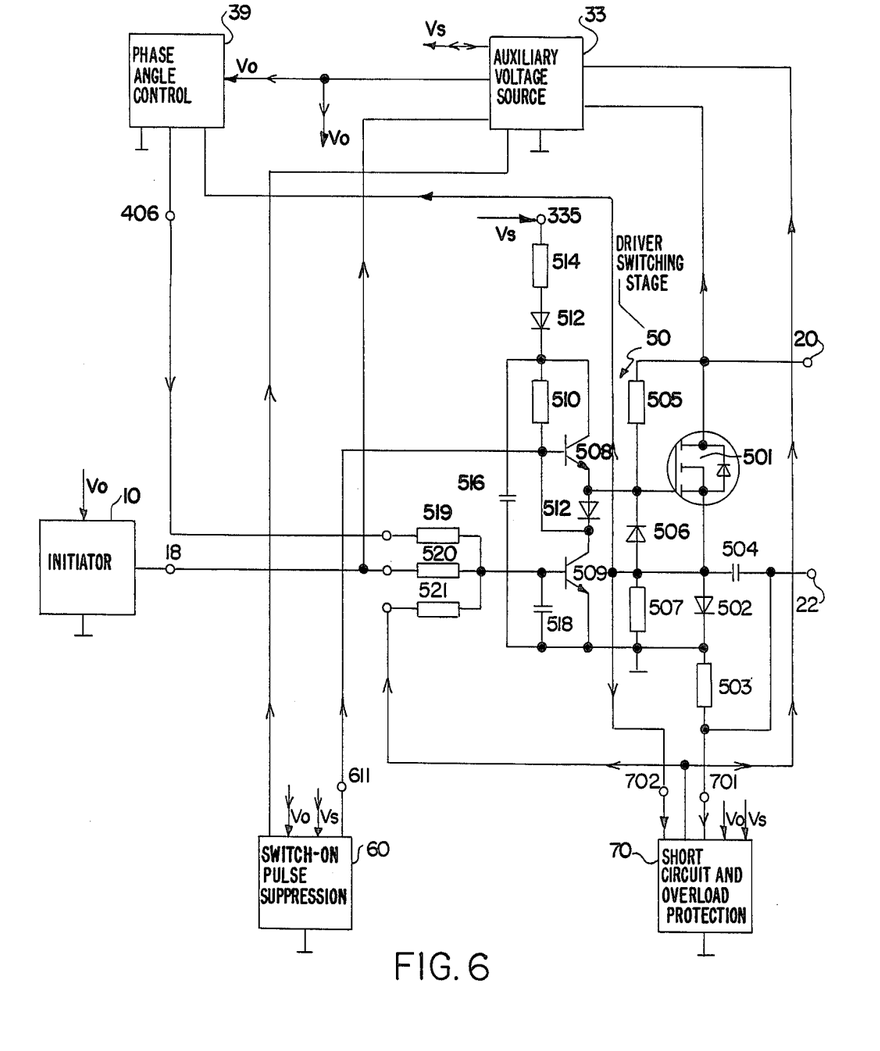

The driver and switching stage 50 is illustrated in detail in FIG. 6. The load circuit comprises between the switch connection lines 20, 22 the series connection of a load transistor 501, a diode 502 and a resistor 503. An anti-interference capacitor 504 is arranged parallel to the series connection 502, 503. The gate electrode of the load transistor 501 in the form of a VMOS power transistor is connected via a resistor 505 to the connection line 20. A Zener diode 506 is arranged parallel to the gate-source path of the transistor 501. A resistor 507 whose end facing away from the source electrode is connected to reference potential, is, furthermore, arranged parallel to the diode 502. Also provided is a push-pull stage with two transistors 508, 509 whose collector-emitter paths are connected in series, and the connection point of the emitter of the transistor 508 and the collector of the transistor 509 is connected to the gate electrode of the transistor 501. Also, the collector of the transistor 509 is directly connected to the base of the transistor 508 which is, furthermore, connected to the output 611 of the circuit 60. The base of the transistor 508 is also connected via a resistor 510 to its collector which is connected via the series connection of a diode 512 and a resistor 514 to the output 335 of the auxiliary voltage source 33. A capacitor 516 is furthermore connected as storage capacitor between the collector of the transistor 508 and the emitter of the transistor 509. An anti-interference capacitor 518 is arranged between the base and the emitter of the transistor 509. The base of the transistor 509 is, furthermore, connected via decoupling resistors 519, 520 and 521 to the output 406 of the phase angle control 39, to the output 18 of the initiator and to an output of the short-circuit and overload protection circuit 70. The resistors 519, 520, 521 serve simultaneously to limit the current and as decoupling elements.

In the driver and switching stage 50 according to FIG. 6, the load transistor 501 is brought into the conducting state when the transistor 508 of the push-pull stage is made conductive, and the increased voltage $V_s$ switches through from the connection 335 of the auxiliary voltage source 33 to the gate electrode of the transistor 501. The transistor 508 does, however, remain blocked as long as the transistor 509 is in the conducting state and connects the base of the transistor 508 to reference potential. Also, the transistor 508 is kept in the blocked state during the switch-on phase by its base being connected to reference potential via the connection 611 of the circuit 60 for switch-on pulse suppression. The transistor 509 is brought into the conducting state when a high-level signal corresponding to a logic "1" is fed to its base from the output 18 of the initiator 10 or from the output 406 of the phase angle control 39 via the resistor 520 or the resistor 519, respectively. This is the case either when the initiator 10 generates a blocking signal corresponding to a logic "1" or when, with the aid of the phase angle control 39, a high-level signal corresponding to a logic "1" is generated, which is the case when neither of the top operational amplifiers 391, 392 generates a positive output signal, which occurs during a predetermined time interval at the beginning of each pulse of the pulsating dc voltage. Accordingly, the transistor 509 is brought into the conducting state either when a blocking signal of the initiator 10 is present or when neither of the operational amplifiers 391, 392 generates a positive outpu signal, which corresponds to an OR condition at the circuit points 18 and 406. On the other hand, the transistor 508 is brought into the conducting state when the transistor 509 is blocked, namely when a driving signal of the initiator 10 in the form of a low-level signal corresponding to a logic "0" is present and when simultaneously at least one of the two operational amplifiers 391, 392 generates a positive output signal. Thus, an AND condition is finally obtained again for the switching state of the transistor 508 if one disregards the negations of various signals occurring in the embodiment for reasons relating to switching techniques. The above-described kind of interrelationship of the output signals of the phase angle control 39 and the initiator 10 was selected so as to additionally enable incorporation of the output signal of the short-circuit and overload protection circuit 70 into the OR condition for driving the transistor 509 of the push-pull stage. The push-pull circuit including the resistors 519, 520 and 521 on the input side, therefore, corresponds, in the embodiment under consideration, to the AND gate 42 of the logic circuit 38 of the embodiment according to FIG. 1.

When the transistor 508 is brought into the conducting state, in dependence upon a driving signal of the initiator 10, and in the presence of a positive output signal of the first operational amplifier 391 at the same time, it applies the higher voltage $V_s$ of, for example, approximately 10 to 14 V to the gate electrode of the load transistor 501, so that the latter is brought into the conducting state, whereupon the precisely predeterminable angle provided by the phase angle control is terminated, since the voltage between the lines 20 and 22 drops immediately to a lower residual voltage, which results in a simultaneous break-down of the voltage $V_s$ at the circuit point 335. The necessary gate voltage of approximately 8 to 10 V for the transistor 501 is now supplied by the previously charged storage capacitor 516. The transistor 501 therefore remains in the conducting state, and the current flowing in the load circuit produces a voltage drop over the resistor 507 which at first is high enough to cause a positive output signal of the second operational amplifier 392. Thus, the high voltage level is maintained at the circuit point 403, even if the voltage over the storage capacitor 344 gradually drops again below the threshold value predetermined by the Zener diode 395 for the first operational amplifier 391. Towards the end of the instant pulse of the pulsating dc voltage, the voltage over the resistor 507 then drops so low that the positive signal at the output of the operational amplifier 392 terminates, and the load transistor 501 is blocked. Accordingly, a precisely predetermined angle provided by the phase angle control is employed to store during each half-wave of the ac voltage present at the input side of the bridge 24, in the storage capacitors 344 and 516, in each case, an adequate amount of energy to operate the entire circuit during the subsequent driven phase of the transistor 501. The connection of the resistor 507 in parallel with the diode 502 ensures, on account of the linear resistance characteristic of the resistor 507, that the transistor 501 is reliably blocked at the end of each half-wave of the ac voltage, so that the precisely predeterminable angle provided by the phase angle control is also attained in practice. The resistor 507 therefore determines the holding current in the load circuit. The Zener diode 506 protects the transistor 501 from too high a gate-source voltage.

Figure 7:
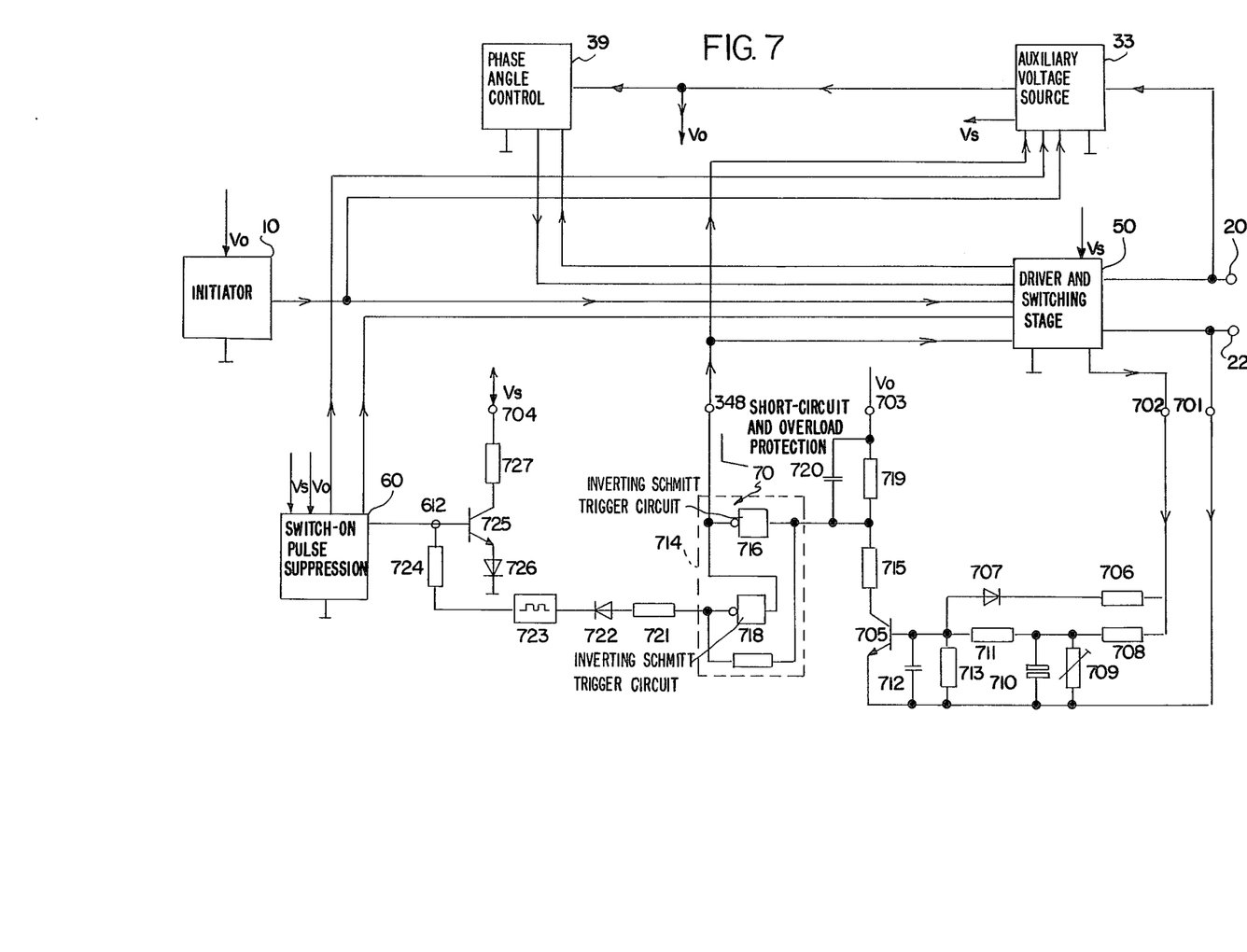

The short-circuit and overload protection circuit mentioned at the outset is illustrated in detail in FIG. 7 and will be described in further detail hereinafter.

The short-circuit and overload protection circuit 70 is connected, on the one hand, directly at an input connection 701 to the switch connection line 22, and, on the other hand, with an input connection 702 to the source electrode of the transistor 501. Two further connections 703 and 704 are connected to the connections 342 and 335, respectively, of the auxiliary voltage source 33, at which the voltages $V_o$ and $V_s$ are present. A transistor 705 whose emitter is connected to the connection 701, is brought without delay into the conducting state, in the event of a short-circuit, via the series connection of a resistor 706 and a Zener diode 707 between its base and the connection 702, if there is a voltage corresponding to a short-circuit current over the resistor 503 of the load circuit, in which case, the Zener diode 707 serves to generate a defined switching threshold. Delayed driving of the transistor 705 is effected via an RC member with the resistors 708 and 709 and a capacitor 710 which is connected via a resistor 711 to the base of the transistor 705. The base of the transistor 705 is furthermore connected via a capacitor 712 and a resistor 713 connected in parallel therewith, to the connection 701. A flip-flop 714 connected via a resistor 715 to the collector of the transistor 705 is driven with the aid of the switching-off signal amplified by the transistor 705. The flip-flop 714 of the embodiment consists of two inverting Schmitt triggers 716 and 718 which are coupled to one another at the output side. When the operating voltage is switched on, the flip-flop is reset by the voltage $V_o$ at the connection 703 via the parallel connection of a resistor 719 and a capacitor 720, in the event that the short-circuit protection had previously responded. When the transistor 705 is then brought into the conducting state, the flip-flop 714 enters its second stable state, and the negated output signal of the Schmitt trigger 716 is fed via the input connection 348 and the resistor 350 to the base of the transistor 351 of the auxiliary voltage source 33 and brings this transistor into the conducting state, so that the transistor 337 is blocked, with the result that the function display realized in the form of the light-emitting diode 339 goes out. At the same time, an astable multivibrator stage 723 with a negated output is released by the inverted output signal of the Schmitt trigger 718 via a resistor 721 and a diode 722, whereby a transistor 725 is brought in a clocked manner into the conducting state via a resistor 724, the emitter of the transistor being connected via a diode 726 to reference potential and its collector via a resistor 727 to the connection 704 which, in turn, corresponds to the connection 335 of the auxiliary voltage source 33 and is connected to it, respectively. The transistor 725 which has been brought into the conducting state draws the drain connection of the transistor 334 towards reference potential, and with each pulse of the astable multivibrator stage, a high current flows through the transistor 334 and through the light-emitting diode 331 connected in series therewith, so that this diode, which normally only emits a weak light, generates bright light flashes signalizing malfunction following response of the short-circuit protection. When the operating voltage is switched on, the connection between the terminal 612 of the circuit 60 and the base of the transistor 725 prevents the latter from being activated.

Figure 8:
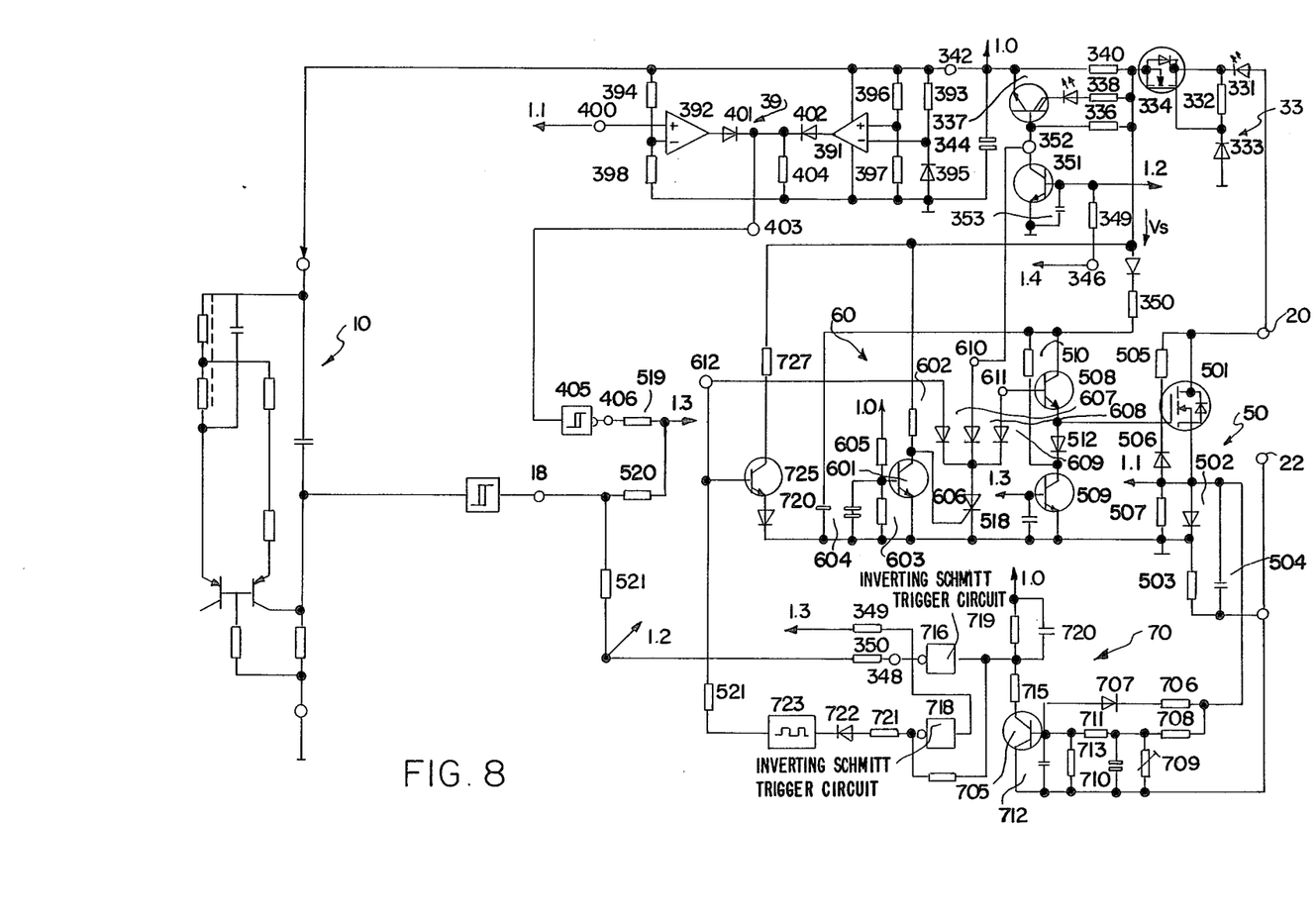
FIG. 8 shows a complete circuit diagram of the two-wire switch according to FIG. 2, in which the initiator is also illustrated in detail.

The individual circuits explained hereinabove with reference to FIGS. 3 to 7 are illustrated jointly in the total circuit diagram according to FIG. 8. The total circuit diagram contains, in addition, a detailed circuit diagram of the initiator 10. In this case, the function of the initiator circuit will not be explained in greater detail since, with the exception of special circuit parts which may serve to check the functioning of the initiator itself, the initiator corresponds fully to a conventional initiator, as shown, for example, in FIG. 1 of German Offenlegungsschrift 3 007 929, but with the trigger stage which, in the known initiator, includes the transistors T3 and T4, illustrated merely as a block.

We claim:

1. Two - wire switch with a power transistor, in particular, a VMOS transistor, which is arranged in series with an auxiliary impedance between two switch connection lines which are connectable to the poles of a dc voltage source which generates a dc voltage pulsating between zero and a maximum value, with an, in particular, contactlessly, externally influenceable initiator which generates blocking and driving signals for the transistor, and with an auxiliary voltage source which generates an auxiliary voltage pulsating with the frequency of the pulsating dc voltage, characterized in that a logic circuit (38) is provided, which comprises a circuit component (40) operating in accordance with an OR function and comprising a first input (a) and a second input (b), and a circuit component (42) operating in accordance with an AND function and comprising two inputs, one of its inputs being connected to an output of the first circuit component (40) and its other input forming a third input (c) of logic circuit (38), in that the first input (a) is connected to an auxil iary voltage source (33), in that the second input (b) is connected to a common connection point of power transistor (30) and auxiliary impedance (32), and in that the third input (c) is connected to output (18) of initiator (10), and in that the logic circuit (38) is so designed that the power transistor (30) is blockable at any point in time by a blocking signal of the initiator (10) and is then drivable by a driving signal of the initiator (10) for the rest of an instant pulse of a pulsating dc voltage when the voltage at the first or second input (a and b, respectively) of the logic circuit (38) exceeds a threshold value corresponding to a logic "1".

2. Two wire switch as defined in claim 1, characterized in that the auxiliary voltage source is formed by a voltage divider (34, 36) arranged between switch connection lines (20, 22), with the first input (a) of the logic circuit (38) being connected to its tap.

3. Two-wire switch as defined in claim 1, characterized in that the auxiliary voltage source (33) is designed as voltage regulator with a storage member (344).

4. Two-wire switch as defined in claim 3, characterized in that the auxiliary voltage source comprises at an input side a transistor (334) having a switching path connection connected to the switch connection line (20) and having a control electrode connected to switch connection line (20) via a resistor (332) and via a Zener diode (333) to reference potential, said transistor further having a switching path electrode connected via a resistor (340) to an output (342) of the auxiliary voltage source (33) theoutput of the auxiliary voltage source being also connected via a capacitor (344) serving as storage member to reference potential, in that the series connection of the switching path of a further transistor (337) and a resistor (338) is arranged parallel to the resistor (340), and in that the base of the further transistor (337) is connected via a resistor (336) to a common connection point of the resistors (338, 340), with this circuit point forming a further output (335) of the auxiliary voltage source (33), at which output a voltage (Vs) which is larger than the voltage (Vo) at the front output (342) of the auxiliary voltage source (33) is available during operation.

5. Two-wire switch as defined in claim 4, characterized in that the transistor connected to the switch connection line (22) is a VMOS transistor (334) and in that the further transistor is a Darlington transistor.

6. Two wire switch as defined in claim 4, further comprising one light emitting diode (331) in the switching path branch of said transistor (334) which indicates a short-circuit condition and another light emitting diode (339) in the switching path branch of said transistor (337) which indicates the functioning state, in that the further output (335) of the auxiliary voltage source (33) is periodically connectable to reference potential in dependence upon response of a short-circuit and overload protection circuit (70), thereby drawing a high current through the switching path of the transistor (334) on the input side, and the light emitting diode (331) conenected in series therewith, so that the latter periodically blinks, and in that the base of the further transistor (337) is connectable to a blocking potential in dependence upon response of the short-circuit and overload protection circuit (70), and also in dependence upon response of a circuit (60) which performs switch-on pulse suppression, so that the light-emitting diode (339) serving to indicate the operational state in the switching path branch of the transistor (337) goes out and the current flowing through the further transistor (337) is blocked.

7. Two-wire switch as defined in claim 1 further comprising a circuit (60) which provides switch-on pulse suppression which generates a blocking signal which blocks power transistor (501) for a preferably settable delay time after dc voltage source (24) is switched on.

8. Two-wire switch as defined in claim 7, characterized in that said switch-on pulse suppression circuit (60) comprises a thyristor (606) which can be brought without delay into the conducting state via its control electrode when the dc voltage source (24) is switched on, thereby generating a blocking signal, and also a further controllable semiconductor switch (601) which is actuatable in dependence upon a control voltage which, originating from the output voltage ($V_0$) of the auxiliary voltage source (33) is generated with the aid of a time member (603, 604, 605), thereby generating a blocking signal for the thyristor.

9. Two-wire switch as defined in claim 8, characterized in that the time member (603, 604, 605) is formed by a resistor/capacitor combination.

10. Two-wire switch as defined in claim 9, characterized in that at least one of the resistors (603, 605) of the resistor/ capacitor combination (603, 604, 605) is designed as adjustable resistor.

11. Two-wire switch as defined in claim 7 characterized in that the blocking signal of the switch-on pulse suppression circuit (60) can be fed to further switching circuits (33, 70) to block the latter.

12. Two-wire switch as defined in claim 11, characterized in that a short-circuit and overload protection circuit (70) is provided which generates, at least for the duration of a short-circuit and overload condition, respectively, a blocking signal to block the power transistor (501) and, possibly, further switching circuits (33).

13. Two-wire switch as defined in claim 12, characterized in that the short-circuit and overload protection circuit (70) comprises a controllable electric switch (705) which is activatable without delay via an input branch containing a Zener diode (707) and with delay via a further input branch containing a time member (708, 709, 710), in particular, an RC member (708, 709, 710), and in that the two input branches are connected in parallel to a circuit point of the power circuit containing the power transistor (501), at which point a voltage corresponding to the current flowing through the power transistor (501) can be tapped.

14. Two-wire switch as defined in claim 12, characterized in that a memory circuit (714) is provided as output circuit of the protection circuit (70).

15. Two-wire switch as defined in claim 14, characterized in that an astable multivibrator, by means of whose output signal the light-emitting diode (331) is activatable to generate periodic flashing signals, is connected to an output of the memory circuit (714).

16. Two-wire switch as defined in claim 13, characterized in that a transistor (705) whose base is connected to the ends of the parallel input branches that face away from the power circuit, and whose emitter is directly connected to the one switch connection line (22), is provided as controllable electric switch (705) of the protection circuit (70), and in that the circuit point of the power circuit connected to the ends of the parallel input branches that face away from the base is connected, on the one hand, to the load transistor (501) and, on the other hand, via a diode (502) to reference potential, and in that a low-resistance measuring resistor (503) is provided between the connection of the diode (502) that is connected to reference potential and the switch connection line (22) connected to the emitter of the transistor (705) of the protection circuit (70).

17. Two-wire switch as defined in claim 1, characterized in that the auxiliary impedance (502, 503) comprises a diode (502) which is connected, on the one hand, to the switching path of the power transistor (501) and, on the other hand, to reference potential, and with which a resistor (507) is connected in parallel.

18. Two-wire switch as defined in claim 1, characterized in that the circuit component of the logic circuit (38) operating in accordance with an OR function is designed as a phase angle control (39) with two operational amplifiers (391, 392) which are both connected, in each case, as comparator and, in each case, comprise one input at which a reference voltage derived from the voltage (V) generated by the auxiliary voltage source (33) is present, in that a voltage proportional to the voltage (V) from the auxiliary voltage source (33) is present at the second input of the one operational amplifier (391), in that a voltage derived from the voltage over the auxiliary impedance (502, 503, 507) is present at the second input of the other operational amplifier (392), and in that the outputs of the operational amplifiers (391, 392) are connected to an output (406) of the phase angle control (39).

19. Two-wire switch as defined in claim 18, characterized in that a trigger circuit (405), possibly with a negated output, is provided at the output (406) of the phase angle control (39).

20. Two-wire switch as defined in claim 6, characterized in that the further transistor (337) is blockable by a blocking signal of the initiator (10).

* * * * *